United States Patent [19]

Murooka et al.

[11] Patent Number: 4,908,087
[45] Date of Patent: Mar. 13, 1990

[54] METHOD OF FORMING A MULTILAYER PRINTED CIRCUIT BOARD AND APPARATUS THEREFOR

[75] Inventors: Hideyasu Murooka; Masayuki Kyooi; Osamu Yamada, all of Yokohama; Noriaki Ujiie, Hadano, all of Japan

[73] Assignee: Hitachi, Ltd., Tokyo, Japan

[21] Appl. No.: 332,377

[22] Filed: Mar. 31, 1989

Related U.S. Application Data

[63] Continuation of Ser. No. 909,227, Sep. 19, 1986, abandoned.

[30] Foreign Application Priority Data

Sep. 20, 1985 [JP] Japan .................. 60-209733

[51] Int. Cl.4 .................. B32B 31/12; B32B 31/20; B32B 31/22; B32B 31/26
[52] U.S. Cl. .................. 156/286; 156/306.9; 156/382; 156/497
[58] Field of Search .................. 156/306.9

[56] References Cited

U.S. PATENT DOCUMENTS

| 3,361,608 | 1/1968 | Janetos | 100/93 P |
| 4,065,340 | 12/1977 | Dickerson | 156/306.9 |
| 4,290,838 | 9/1981 | Reavill | 156/306.6 |
| 4,396,451 | 8/1983 | Yeager | 156/285 |
| 4,681,718 | 7/1987 | Oldham | 264/102 |

FOREIGN PATENT DOCUMENTS 1413320 11/1975 United Kingdom .................. 156/580

Primary Examiner—George F. Lesmes
Assistant Examiner—J. Davis
Attorney, Agent, or Firm—Antonelli, Terry & Wands

[57] ABSTRACT

A method and an apparatus of forming a multilayer printed circuit board which can positively remove voids in the prepregs in the printed board and enhance the reliability of the produced printed circuit board and is superior in economy, wherein a laminated assembly of a plurality of printed circuit board components and a plurality of prepregs alternately laminated on each other is sandwiched between upper and lower jig plates, and the laminated assembly sandwiched between the jig plates is clamped between heating plates of a bonding press to heat the assembly to a predetermined temperature, and, thereafter, a pressure is applied to the upper and lower jig plates so as to urge them against each other for bonding the printed circuit board component and the prepregs. An exterior pressurizing means is provided around the printed circuit board components and the prepregs sandwiched between the upper and lower jig plates in order to prevent the molten prepregs from flowing outwardly, thereby raising the fluid pressure of the molten prepregs to squeeze out air bubbles existing in the prepregs.

3 Claims, 5 Drawing Sheets

RELATIONSHIP BETWEEN TIME OF
EVACUATION AND NUMBER OF VOIDS

VAPOR PRESSURES OF SOLVENT AND WATER IN BONDING AGENT

METHOD OF FORMING A MULTILAYER PRINTED CIRCUIT BOARD AND APPARATUS THEREFOR

This application is a continuation application of application Ser. No. 909,227, filed Sept. 19, 1986, now abandoned.

BACKGROUND OF THE INVENTION

The present invention relates to a method of forming a multilayer printed circuit board and an apparatus for carrying out the method and, more particularly, to a method of forming a multilayer printed circuit board in the manner that it is free of any voids formed therein wherein a plurality of printed circuit board components and a plurality of prepregs are alternately laminated upon each other and pressed together by a bonding press to form the multilayer printed circuit board and an apparatus for carrying out the method.

A multilayer printed circuit board comprises a plurality of printed circuit board components and a plurality of prepregs alternately laminated upon each other and compressed together by using a bonding press in general, the prepregs being of a bonding resin comprising a polyimide resin, for example.

In other words, the laminated assembly of the printed circuit board components and the prepregs alternately laminated upon each other is sandwiched between an upper jig plate and a lower jig plate before the assembly is integrally pressed and bonded. Occurrence of shifting of positions of the printed circuit board components relative to each other is prevented by using aligning pins. After the laminated assembly of the printed circuit board components is sandwiched between the upper jig plate and the lower jig plate, the upper jig plate and the lower jig plate are clamped between heating plates of a bonding press to raise the temperature of the plates to a predetermined value, and, thereafter, the upper jig plate and the lower jig plate are pressed against each other with the printed circuit board components and the prepregs sandwiched therebetween so as to bond the printed circuit board components and the prepregs with each other.

However, when a multilayer printed circuit board is formed by using a bonding press as described above, particularly, when a plurality printed circuit board components and a plurality of prepregs are laminated alternately and pressed against each other so as to be bonded with each other, voids tend to be generated within the prepregs and, when voids are generated in the prepregs, inferior insulation will take place around throughholes of the printed circuit board thereby not only deteriorating the reliability of the multilayer printed circuit board but also lowering the yield of products.

In consideration of the above, there has been proposed a method of voidless or pore-free formation of a multilayer printed circuit board using a vacuum press as disclosed in a catalogue "JSW-VPI Vacuum Press" published by Kabushikikaisha Nihonseikosho on Apr. 1, 1985.

The method of forming a multilayer printed circuit board by the vacuum press process comprises placing the laminated assembly of the printed circuit board components and the prepregs within a bag before they are integrally pressed and bonded with each other, locating the bag in a high pressure tank, and, thereafter, exhausting the interior of the bag so as to render the interior of the bag to be in vacuum state, and, then, subjecting the bag to an atmosphere of an inert gas of a high temperature and a high pressure from the exterior of the bag so as to complete a multilayer printed circuit board. With such a method, the interior of the prepregs can be effectively made voidless or pore-free.

However, when a multilayer printed circuit board is formed by using a vacuum press, an expensive high pressure tank and a heating and pressurizing apparatus are required, and, further, caution must be taken in manipulating the high pressure tank and the heating and pressurizing apparatus.

SUMMARY OF THE INVENTION

An object of the present invention is to provide a method and an apparatus of forming a multilayer printed circuit board of a high reliability and an economical nature by using a bonding press which is easy to manipulate, the method and the apparatus being capable of effectively making the interior of the solidified bonding agent voidless or pore-free.

In order to achieve the above object, the present invention comprises the steps of laminating a plurality of printed circuit board components and a plurality of prepregs alternately upon each other to form a laminated assembly, sandwiching the assembly between an upper jig plate and a lower jig plate, clamping the upper jig plate and the lower jig plate having the assembly sandwiched therebetween between heating plates of a bonding press so as to heat them to a predetermined temperature, and then pressing the upper jig plate and the lower jig plate against each other with the assembly held therebetween thereby bonding the printed circuit board components and the prepregs alternately laminated upon each other, the present invention being characterized by providing an exterior pressurizing means positioned around the periphery of the assembly of the printed circuit board components and the prepregs sandwiched between the upper jig plate and the lower jig plate for preventing the molten prepregs from flowing out of the assembly thereby raising the fluid pressure of the molten prepregs so that air bubbles existing in the interior of the prepregs are squeezed.

DETAILED DESCRIPTION OF THE PREFERRED EMBODIMENTS

Figure 1:
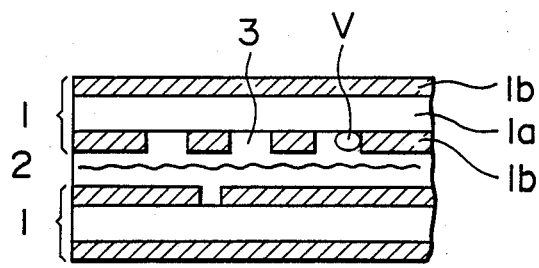
FIG. 1 is a longitudinal sectional view showing the construction of the interior of a multilayer printed circuit board.

In general, a multilayer printed circuit board comprises printed circuit board components 1 and a prepreg 2 laminated on each other as shown in FIG. 1. Each of the printed circuit board components 1 is constructed by a substrate 1a and a copper foil 1b, a predetermined pattern being etched out from the copper foil 1b. In FIG. 1, portions etched out from the copper foil 1b are designated by the reference numeral 3.

Figure 2:
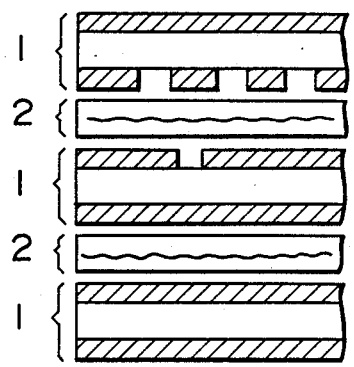
FIG. 2 is a longitudinal sectional view of a multilayer printed circuit board in which a plurality of printed circuit board components and a plurality of prepregs are alternately laminated upon each other.

FIG. 2 is a longitudinal sectional view showing a multilayer printed circuit board constructed by a plurality of printed circuit board components designated by the reference numeral 1 in FIG. 1 and a plurality of prepregs designated by the reference numeral 2 in FIG. 1 alternately laminated on each other. The method of forming the multilayer printed circuit board by using a bonding press will be described below on the basis of FIG. 3.

Figure 3:
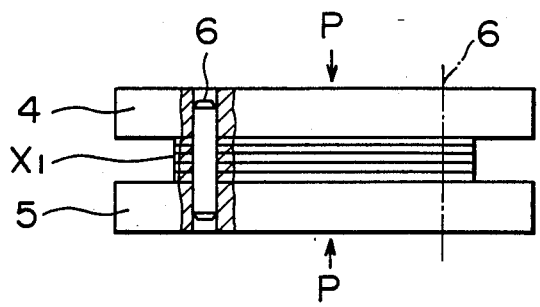
FIG. 3 is a front view showing the state in which a multilayer printed circuit board is being formed.

In FIG. 3, the reference numeral $X_1$ designates a laminated assembly of the printed circuit board components and the prepregs alternately laminated on each other before the assembly is integrally bonded. The laminated assembly $X_1$ is sandwiched between an upper jig plate 4 and a lower jig plate 5. In this case, shifting of the printed circuit board components relative to each other is avoided by virtue of aligning pins 6. After the laminated assembly $X_1$ is sandwiched between the upper jig plate 4 and the lower jig plate 5 as described above, the upper jig plate 4 and the lower jig plate 5 are clamped between heating plates (not shown) of a bonding press with the assembly $X_1$ held between the jig plates 4, 5 to heat them to a predetermined temperature. After they are heated, the upper jig plate 4 and the lower jig plate 5 are subjected to force P to press them against each other so that the printed circuit board components and the prepregs are bonded with each other.

Figure 4:
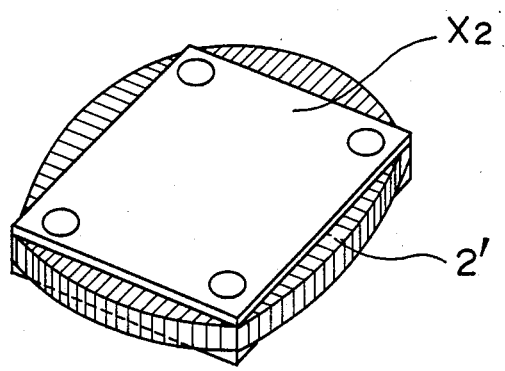
FIG. 4 is a perspective view showing the appearance of a multilayer printed circuit board formed by the method of forming as shown in FIG. 3.

FIG. 4 is a perspective view showing the appearance of the multilayer printed circuit board $X_2$ thus formed. Flashes 2′ are formed around the multilayer printed circuit board $X_2$ which are formed by the molten prepregs forced out from the periphery of the assembly $X_1$ during the time the assembly $X_1$ is heated and pressed and solidified.

Figure 5:
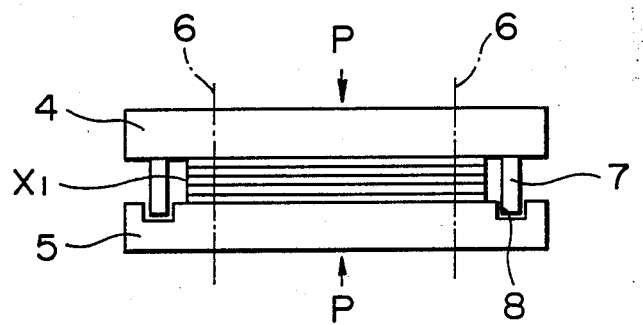
FIG. 5 is a front view showing the state in which a multilayer printed circuit board is being formed by using jig plates suitable for use in carrying out the method of the present invention.

An embodiment of the method of forming a multilayer printed circuit board according to the present invention and the apparatus for carrying out the method will be described below with reference to FIG. 5–9. FIG. 5 is a front view showing the state in which a multilayer printed circuit board is being formed by using jig plates suitable for use in the embodiment of the method of the present invention. In FIG. 5, reference character $X_1$ designates a laminated assembly of a plurality of printed circuit board components 1 and a plurality of prepregs 2 alternately laminated on each other as in the case of FIG. 1, and the reference numerals 4 and 5 designate the upper and lower jig plates, respectively, while the reference numeral 6 designates aligning pins for preventing relative shifting of positions of the printed circuit board components. An enclosing member 7 is attached to the upper jig plate 4 so as to enclose the assembly $X_1$ therein for preventing the molten prepregs from flowing out of the assembly $X_1$ during the time the heating plates of a bonding press heat the assembly $X_1$. A groove 8 is formed in the lower jig plate 5 around the assembly $X_1$ so as to receive the lower end edge of the enclosing member 7. Thus, after the assembly $X_1$ is sandwiched between the upper jig plate 4 and the lower jig plate 5, the upper jig plate 4 and the lower jig plate 5 are clamped between heating plates (not shown) of a bonding press to heat them to a predetermined temperature. Thereafter, a force P is applied to the upper jig plate 4 and the lower jig plate 5 to urge them against each other with the assembly $X_1$ held therebetween so as to bond the printed circuit board components and the prepregs with each other.

Figure 6:
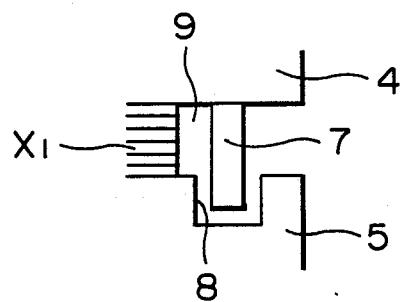
FIG. 6 is an enlarged view showing the portion around an enclosing member shown in FIG. 5.
Figure 9:
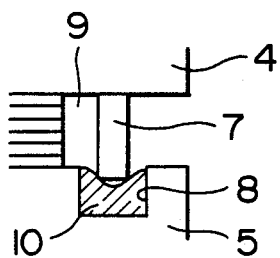
FIG. 9 is a fragmentary enlarged front view showing an alternative embodiment of jig plates suitable for use in carrying out the method of the present invention.

In FIG. 6 which is an enlarged view of a portion of FIG. 5, flash collecting space 9 is formed between the enclosing member 7 attached to the upper jig plate 4 and the laminated assembly $X_1$, and the volume of the flash collecting space 9 is set to be smaller than the amount of the molten prepregs forced out of the assembly $X_1$ and forming the flash during the pressurizing and heating of the assembly $X_1$ by the heating plates of the bonding press previously described. The amount of the molten prepreg forced out of the assembly $X_1$ can be preliminarily determined from the relationship between the viscosity of molten prepreg actually used and the pressing force of the heating plates of the bonding press. In case the viscosity of the molten prepreg actually used is very low, as shown in FIG. 9, it is preferred to provide a receiving member 10 made to a material having cushioning nature and locate it in the groove 8 of the lower jig plate 5 so as to support the lower end edge of the enclosing member 7 thereby positively preventing the molten prepreg from flowing out to the exterior. A receiving member 10 made of silicone rubber is particularly effective.

Figure 8:
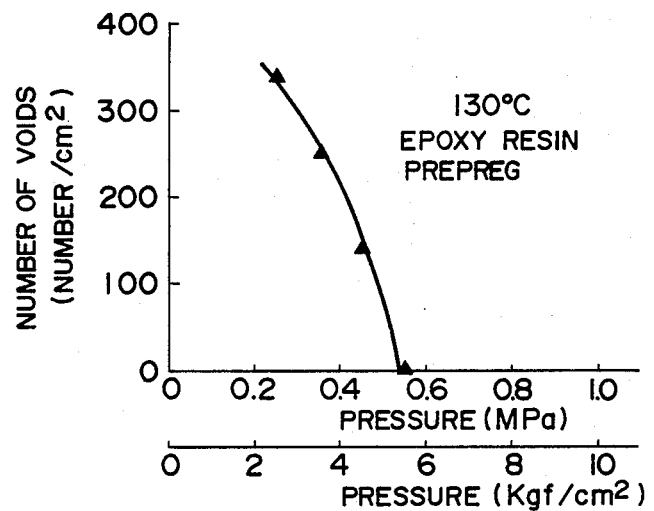
FIG. 8 is a diagram showing the relationship between the bonding pressure and the number of voids occuring in the multilayer printed circuit board formed by the method of the present invention.

When the molten prepreg is fully filled in the flash collecting space 9 as the heating and pressurization of the assembly $X_1$ by the heating plates of the bonding press proceeds, the fluid pressure of the entire molten prepreg becomes equal to the pressure applied by the heating plates of the bonding press (the value of the force P shown in FIG. 5 divided by the area of the printed board), and air bubbles or voids existing within the prepregs of the assembly $X_1$ are squeezed out. FIG. 8 shows the results of the tests for ascertaining the relationship between the bonding pressure of the multilayer printed circuit board formed by the present invention and the number of voids.

As is clear from FIG. 8, the number of voids decreases as the bonding pressure is raised and finally the voids are squeezed out. In other words, the voids are removed at a pressure of a certain value of higher, and, in the case of the tests using epoxy resin, it has been ascertained that the voids are squeezed out at a pressure of 5.6 kgf/cm², which proves the effectiveness of the present invention.

Figure 7:
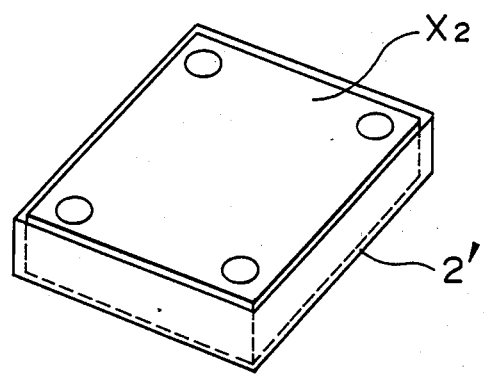
FIG. 7 is a perspective view of the appearance of the multilayer printed circuit board formed by the method of the present invention.

FIG. 7 is a perspective view showing the appearance of the multilayer printed circuit board formed by the method of the present invention. Flashes 2' are generated around the periphery of the completed multilayer printed circuit board $X_2$. There flashes 2' are formed by the molten prepreg forced out of the assembly $X_1$ and solidified when the assembly $X_1$ is heated and pressed as shown in FIG. 5. It is clear that the flashes 2' shown in FIG. 7 is far smaller than the flashes 2' formed in the completed multilayer printed circuit board $X_2$ formed by the prior art method using the bonding press as shown in FIG. 4.

With the present invention, formation of voidless or pore-free multilayer printed circuit board can be effectively achieved thereby permitting the inferior insulation around the through-holes in the printed circuit board tending to occur due to the existence of the voids to be positively avoided. Not only the reliability of the multilayer printed board is maintained, but also the yield of the products is enhanced.

As described above, the present invention can be carried out by using a bonding press which is far inexpensive in the cost of equipment in comparison with a vacuum press and is easy to manipulate, wherein an enclosing member is provided in the jig plate for preventing the free flow of molten prepreg out of the laminated assembly to raise the fluid pressure of the molten prepreg thereby permitting the voids in the molten prepregs to be effectively squeezed out.

Another embodiment of the method and the apparatus of the present invention will be described below.

This embodiment is characterized in that the laminated assembly of the printed circuit board components and the prepregs alternately laminated on each other is sandwiched between an upper mold plate and a lower mold plate with the upper and lower ends of each of the aligning pins slidably engaged in aligning holes in the assembly being slidably fitted in guide holes formed in the upper and lower mold plates. The upper and lower mold plates having the assembly sandwiched therebetween is inserted into the space between upper and lower jig plates which are slidable relative to each other in the direction of application of pressure to be applied by a bonding press and which are provided with sealing means for preventing leakage of gas through the portions of the upper and lower jig plates slidable relative to each other. The space between the upper and lower jig plates is exhausted to render the space to be in vacuum state so as to draw air within fine spaces formed between the insulating bonding agent and the printed circuit board components in the laminated assembly, and, thereafter, the thus exhausted jig plates having mold plates and the laminated assembly is placed between heating plates of the bonding press to heat and press the same thereby melting the bonding agent and filling the fine spaces with the molten bonding agent. Finally, the space between the upper and lower jig plates is pressurized by dry air to a pressure above the vapor pressure of the water vapor and the vapor of the bonding agent until the bonding agent is solidified thereby completing the multilayer printed circuit board.

The above described embodiment will be described in more detail with reference to FIG. 10.

Figure 10:
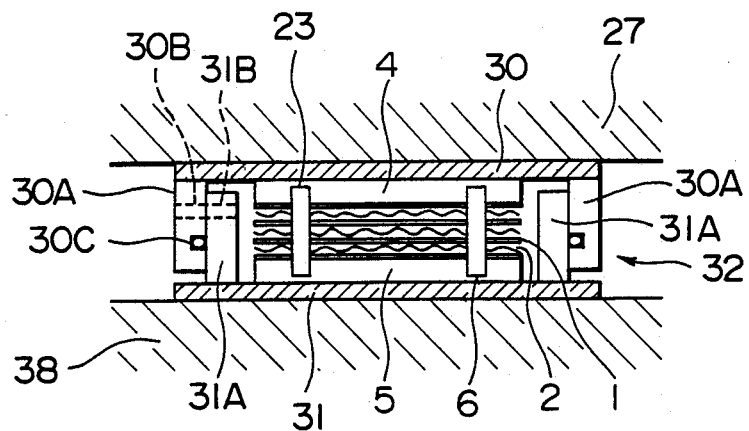
FIG. 10 is a sectional view showing another embodiment of the apparatus of forming the multilayer printed circuit board according to the present invention.

In FIG. 10, the reference numeral 1 designates the printed circuit board components each comprising a base plate of an insulating glass epoxy resin having copper foils with patterns etched out therefrom attached to both side surfaces thereof. The reference numeral 2 designates the prepregs of an insulating bonding agent. The printed circuit board components 1 are formed with aligning holes at predetermined positions, and several number of the printed circuit board components 1 and the prepregs 2 are laminated alternately on each other with aligning pins 6 inserted through the aligning holes of each printed circuit board component 1 so as to prevent the relative shifting of positions of the printed circuit board components 1. The upper and lower ends of each of the aligning pins 6 are slidably inserted into aligning holes formed in upper jig plate 4 and lower jig plate 5, respectively, so that the laminated assembly of the printed circuit board components 1 and the prepregs 2 alternately laminated on each other is sandwiched between the upper and lower jig plates 4, 5.

The thus formed assembly is inserted into the space between an upper plate 30 and a lower plate 31 forming a vacuum and high pressure applying device 32.

The vacuum and high pressure applying device 32 comprising the upper plate 30 and the lower plate 31 is so constructed that the upper plate 30 and the lower plate 31 are movable relative to each other in the direction of the load applied thereto and they are provided with an upper frame 30A and a lower frame 31A each located at the periphery each of the upper plate 30 and the lower plate 31 which are slidably engaged with each other and provided with a sealing member 30C capable of preventing leakage of gas and maintaining the space defined by the upper plate 30, the upper frame 30A, the lower frame 31A and the lower plate 31 at about a vacuum of 1 Torr and at a high pressure of about 30 kgf/cm² suction. Pressurizing ports 30B, 31B are formed in the upper and lower frames 30A, 31A, respectively, in order that the space defined between the upper and lower plates 30, 31 and surrounded by the upper and lower frames 30A, 31A can be evacuated and thereafter pressurized to a pressure of 30 kgf/cm².

After the upper and lower jig plates 4, 5 having the laminated assembly of the printed circuit board components 1 and the prepregs 2 sandwiched therebetween are inserted into the space defined by the vacuum and high pressure applying device 32, evacuation of the space therein is commenced through the suction and pressurizing ports 30B, 31B. After the space within the vacuum and high pressure applying device 32 has been sufficiently evacuated, it is placed between an upper heating plate 27 and a lower heating plate 38 of a bonding press (not shown) which are heated to a predetermined high temperature so as to heat the vacuum and high pressure applying device 32 together with the laminated assembly sandwiched between the upper and lower jig plates 4, 5 and, thereafter, pressure is applied to the upper and lower plates 30, 31 so as to press them against each other.

Figure 11:
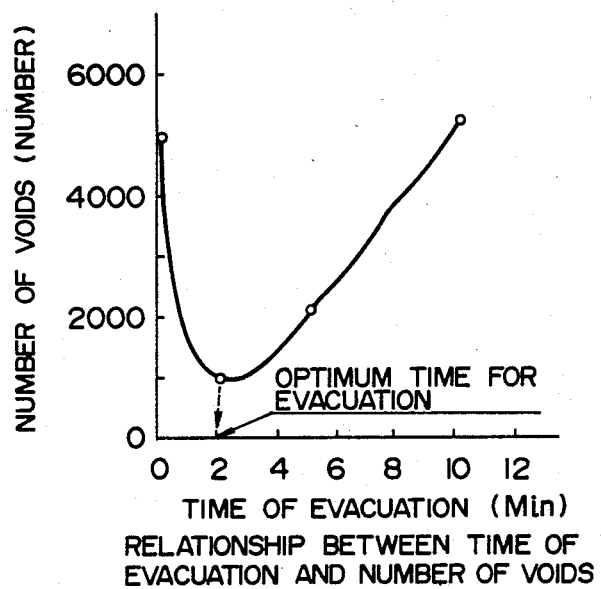
FIG. 11 is a diagram showing the relationship between the vacuum suction time period and the number of voids for determining the optimum vacuum suction time period.
Figure 12:
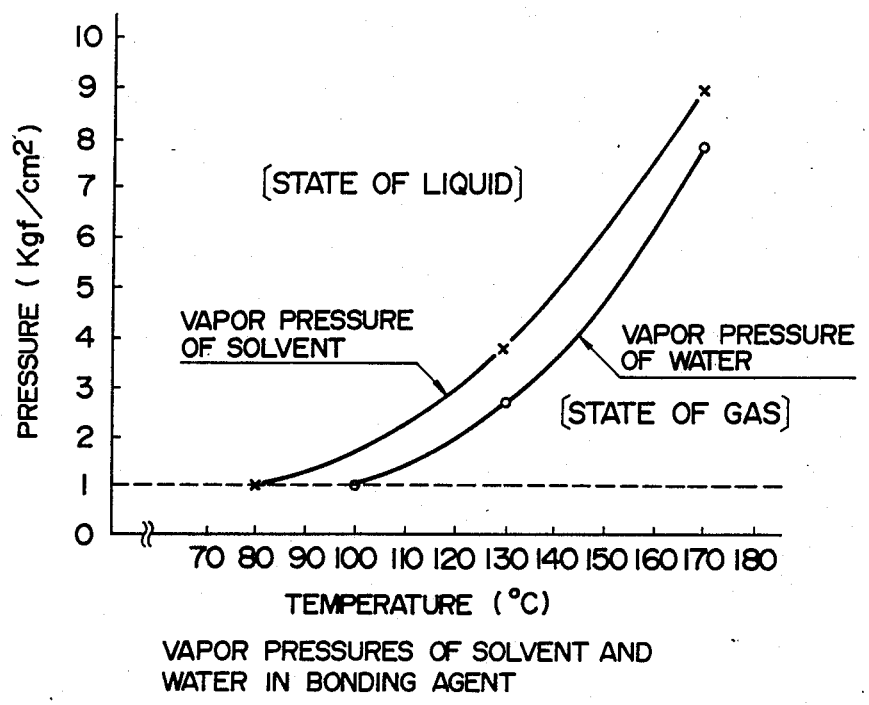
FIG. 12 is a diagram showing the vapor pressure of the solvent and water in the bonding agent before and after the bonding temperature is achieved.

After the lapse of the optimum time period for drawing air for evacuation of the space within the vacuum and high pressure applying device 32 as shown in FIG. 11, the evacuation is stopped and dry air of a high pressure having the value higher than the vapor pressure shown in FIG. 12 is introduced into the space within the vacuum and high pressure applying device 32 through the suction and pressurizing ports 30B, 31B. After the space is maintained at the above described high pressure for a predetermined time period, the vacuum and high pressure applying device 32 is cooled and depressurized and the laminated assembly is taken out from the vacuum and high pressure applying device 32 and bonding process of the multilayer printed circuit board is completed.

According to the above described embodiment of the present invention, since the space within the vacuum and high pressure applying device can be exhausted for achieving vacuum therein for a long time period without melting the prepregs in the laminated assembly by heating the same, superior effectiveness is obtained in suppressing voids remaining within the solidified bonding agent by virtue of the fact that air existing in the fine spaces between the printed circuit board components and the prepregs can be sufficiently drawn out and the pressure in the space of the vacuum and high pressure applying device can be maintained at a pressure at which the solvent and water in the molten bonding agent will not evaporate.

According to the present invention, since the voids generated between the printed circuit board components and the prepregs in the laminated assembly during the bonding step thereof can be positively decreased, remarkable increase in the reliability of the multilayer printed circuit board in connecting the same to elements for use therewith can be achieved by reducing the inferior insulation tending to occur around through-holes due to the existence of the voids with a remarkable improvement in the yield of the products obtained by the reduction of the voids which would otherwise result in inferior products.

What is claimed is:

1. A method of forming a multilayer printed circuit board comprising the steps of:

placing a laminated assembly of a plurality of printed circuit board components and a plurality of prepregs of bonding agent alternately laminated on each other between an upper jig plate and a lower jig plate, and applying heat and pressure to said laminated assembly in a thickness direction of said laminated assembly from upper and lower sides thereof through the upper and lower jig plates, thereby bonding said printed circuit board components and said prepregs with each other, characterized by inserting said laminated assembly placed between said upper and lower jig plates into a space within a vacuum and high pressure applying means constituted by an upper plate and a lower plate each provided with an enclosing frame located around said laminated assembly and shiftably engaged with each other in the thickness direction of said laminated assembly and having sealing means for preventing leakage of gas through said enclosing frames, sufficiently evacuating said space within said vacuum and high pressure applying means, thereafter heating and applying pressure to said laminated assembly in the thickness direction of said laminated assembly through the upper and lower jig plates, within said vacuum and high pressure applying means so as to melt said prepregs for filling vacancies between patterns on said printed circuit board components with said bonding agent, and pressurizing said space with a gas immediately after filling said vacancies with said bonding agent to a pressure above the vapor pressure of water and solvent contained in said bonding agent and maintaining the pressurization with said gas until said bonding agent solidifies, while continuing to apply pressure to said laminated assembly from upper and lower sides of the laminated assembly in the thickness direction thereof through the upper and lower jig plates, thereby permitting voids caused by air remaining in fine spaces between said printed circuit board components and said prepregs in said laminated assembly as well as voids generated by gasification of the water and the solvent in said bonding agent to be positively avoided.

2. A method of forming a multilayer printed circuit board according to claim 1, wherein the step of evacuating said space within said vacuum and high pressure applying means is continued for a time period optimum for reducing the number of voids in said bonding agent.

3. A method of forming a multilayer printed circuit board according to claim 2, wherein said step of evacuating said space within said vacuum and high pressure applying means is continued for a period of about 2 minutes.

* * * * *